United States Patent
Sarkar et al.

(10) Patent No.: US 12,142,553 B2
(45) Date of Patent: Nov. 12, 2024

(54) GUARD RING DESIGN ENABLING IN-LINE TESTING OF SILICON BRIDGES FOR SEMICONDUCTOR PACKAGES

(71) Applicant: Intel Corporation, Santa Clara, CA (US)

(72) Inventors: Arnab Sarkar, Chandler, AZ (US); Sujit Sharan, Chandler, AZ (US); Dae-Woo Kim, Phoenix, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 18/138,512

(22) Filed: Apr. 24, 2023

(65) Prior Publication Data
US 2023/0260884 A1 Aug. 17, 2023

Related U.S. Application Data

(60) Continuation of application No. 17/573,479, filed on Jan. 11, 2022, now Pat. No. 11,676,889, which is a (Continued)

(51) Int. Cl.
*H01L 23/498* (2006.01)
*H01L 21/66* (2006.01)
(Continued)

(52) U.S. Cl.
CPC ........ *H01L 23/49827* (2013.01); *H01L 22/32* (2013.01); *H01L 23/544* (2013.01);
(Continued)

(58) Field of Classification Search
CPC . H01L 23/49827; H01L 22/32; H01L 23/544; H01L 23/585; H01L 24/10; H01L 25/0655
See application file for complete search history.

(56) References Cited

U.S. PATENT DOCUMENTS 7,161,175 B2 * 1/2007 Shau ................ G01R 31/2856
257/E21.524
7,498,667 B2 3/2009 Ha
(Continued)

FOREIGN PATENT DOCUMENTS

| CN | 1779469 | 5/2006 |
|---|---|---|
| CN | 101246859 | 8/2008 |

(Continued)

OTHER PUBLICATIONS

International Search Report and Written Opinion for International Patent Application No. PCT/US2015/058072 mailed Jul. 29, 2016, 15 pgs.
(Continued)

*Primary Examiner* — Walter H Swanson
(74) *Attorney, Agent, or Firm* — Schwabe, Williamson & Wyatt P.C.

(57) ABSTRACT

Guard ring designs enabling in-line testing of silicon bridges for semiconductor packages, and the resulting silicon bridges and semiconductor packages, are described. In an example, a semiconductor structure includes a substrate having an insulating layer disposed thereon. A metallization structure is disposed on the insulating layer. The metallization structure incudes conductive routing disposed in a dielectric material stack. The semiconductor structure also includes a first metal guard ring disposed in the dielectric material stack and surrounding the conductive routing. The first metal guard ring includes a plurality of individual guard ring segments. The semiconductor structure also includes a second metal guard ring disposed in the dielectric material stack and surrounding the first metal guard ring. Electrical testing features are disposed in the dielectric material stack, between the first metal guard ring and the second metal guard ring.

20 Claims, 12 Drawing Sheets

Related U.S. Application Data division of application No. 16/542,248, filed on Aug. 15, 2019, now Pat. No. 11,257,743, which is a continuation of application No. 15/749,465, filed as application No. PCT/US2015/058072 on Oct. 29, 2015, now Pat. No. 10,418,312.

(51) Int. Cl.
| | |
|---|---|
| H01L 23/00 | (2006.01) |
| H01L 23/544 | (2006.01) |
| H01L 23/58 | (2006.01) |
| H01L 25/065 | (2023.01) |
| H01L 25/18 | (2023.01) |

(52) U.S. Cl.
CPC ............ *H01L 23/585* (2013.01); *H01L 24/10* (2013.01); *H01L 25/0655* (2013.01); *H01L 24/16* (2013.01); *H01L 25/18* (2013.01); *H01L 2223/54426* (2013.01); *H01L 2223/54453* (2013.01); *H01L 2224/14* (2013.01); *H01L 2224/16227* (2013.01); *H01L 2924/1431* (2013.01); *H01L 2924/1432* (2013.01); *H01L 2924/1434* (2013.01); *H01L 2924/1517* (2013.01); *H01L 2924/15192* (2013.01); *H01L 2924/15313* (2013.01); *H01L 2924/3512* (2013.01)

(56) References Cited

U.S. PATENT DOCUMENTS

| 7,642,625 B2 | 1/2010 | Otsuki |
| 2005/0194649 A1 | 9/2005 | Oki |
| 2007/0102791 A1 | 5/2007 | Wu |
| 2007/0108581 A1 | 5/2007 | Shim |
| 2008/0265378 A1 | 10/2008 | Lee et al. |
| 2011/0272790 A1 | 11/2011 | Choi |
| 2012/0007211 A1 | 1/2012 | Aleksov et al. |
| 2013/0026466 A1 | 1/2013 | Pagani |
| 2014/0027928 A1 | 1/2014 | Watanabe |
| 2014/0097861 A1 | 4/2014 | Okutsu et al. |
| 2016/0276233 A1 | 9/2016 | Wood |

FOREIGN PATENT DOCUMENTS

| CN | 102810528 | 12/2012 |
| CN | 102881660 | 1/2013 |
| CN | 103151003 | 6/2013 |
| JP | 2008-311455 | 12/2008 |

OTHER PUBLICATIONS

International Preliminary Report on Patentability for International Patent Application No. PCT/US2015/058072 mailed May 11, 2018, 12 pgs.

Office Action from Taiwan Patent Application No. 201580083473.5, mailed Jan. 2, 2020, 10 pages.

Office Action from Chinese Patent Application No. 201580083473.5, mailed Jan. 25, 2021, 6 pages.

Notice of Allowance from Taiwan Patent Application No. 105127892, mailed Aug. 6, 2020, 3 pages.

Notice of Allowance from Chinese Patent Application No. 201580083473.5, mailed Oct. 20, 2021, 8 pages.

\* cited by examiner

GUARD RING DESIGN ENABLING IN-LINE TESTING OF SILICON BRIDGES FOR SEMICONDUCTOR PACKAGES

CROSS-REFERENCE TO RELATED APPLICATION

This patent application is a continuation of U.S. patent application Ser. No. 17/573,479, filed Jan. 11, 2022, which is a divisional of U.S. patent application Ser. No. 16/542,248, filed Aug. 15, 2019, now U.S. Pat. No. 11,257,743, issued Feb. 22, 2022, which is a continuation of U.S. patent application Ser. No. 15/749,465, filed Jan. 31, 2018, now U.S. Pat. No. 10,418,312, issued Sep. 17, 2019, which is a U.S. National Phase Application under 35 U.S.C. § 371 of International Application No. PCT/US2015/058072, filed Oct. 29, 2015, entitled "GUARD RING DESIGN ENABLING IN-LINE TESTING OF SILICON BRIDGES FOR SEMICONDUCTOR PACKAGES," which designates the United States of America, the entire disclosure of which are hereby incorporated by reference in their entirety and for all purposes.

TECHNICAL FIELD

Embodiments of the invention are in the field of semiconductor packages and, in particular, guard ring designs enabling in-line testing of silicon bridges for semiconductor packages and the resulting silicon bridges and semiconductor packages.

BACKGROUND

Today's consumer electronics market frequently demands complex functions requiring very intricate circuitry. Scaling to smaller and smaller fundamental building blocks, e.g. transistors, has enabled the incorporation of even more intricate circuitry on a single die with each progressive generation. Semiconductor packages are used for protecting an integrated circuit (IC) chip or die, and also to provide the die with an electrical interface to external circuitry. With the increasing demand for smaller electronic devices, semiconductor packages are designed to be even more compact and must support larger circuit density. Furthermore, the demand for higher performance devices results in a need for an improved semiconductor package that enables a thin packaging profile and low overall warpage compatible with subsequent assembly processing.

C4 solder ball connections have been used for many years to provide flip chip interconnections between semiconductor devices and substrates. A flip chip or Controlled Collapse Chip Connection (C4) is a type of mounting used for semiconductor devices, such as integrated circuit (IC) chips, MEMS or components, which utilizes solder bumps instead of wire bonds. The solder bumps are deposited on the C4 pads, located on the top side of the substrate package. In order to mount the semiconductor device to the substrate, it is flipped over—the active side facing down on the mounting area. The solder bumps are used to connect the semiconductor device directly to the substrate.

Processing a flip chip is similar to conventional IC fabrication, with a few additional steps. Near the end of the manufacturing process, the attachment pads are metalized to make them more receptive to solder. This typically consists of several treatments. A small dot of solder is then deposited on each metalized pad. The chips are then cut out of the wafer as normal. To attach the flip chip into a circuit, the chip is inverted to bring the solder dots down onto connectors on the underlying electronics or circuit board. The solder is then re-melted to produce an electrical connection, typically using an ultrasonic or alternatively reflow solder process. This also leaves a small space between the chip's circuitry and the underlying mounting. In most cases an electrically-insulating adhesive is then "underfilled" to provide a stronger mechanical connection, provide a heat bridge, and to ensure the solder joints are not stressed due to differential heating of the chip and the rest of the system.

Newer packaging and die-to-die interconnect approaches, such as through silicon via (TSV), silicon interposers and silicon bridges, are gaining much attention from designers for the realization of high performance Multi-Chip Module (MCM) and System in Package (SiP). However, additional improvements are needed for such newer packaging regimes.

DESCRIPTION OF THE EMBODIMENTS

Figure 1A:
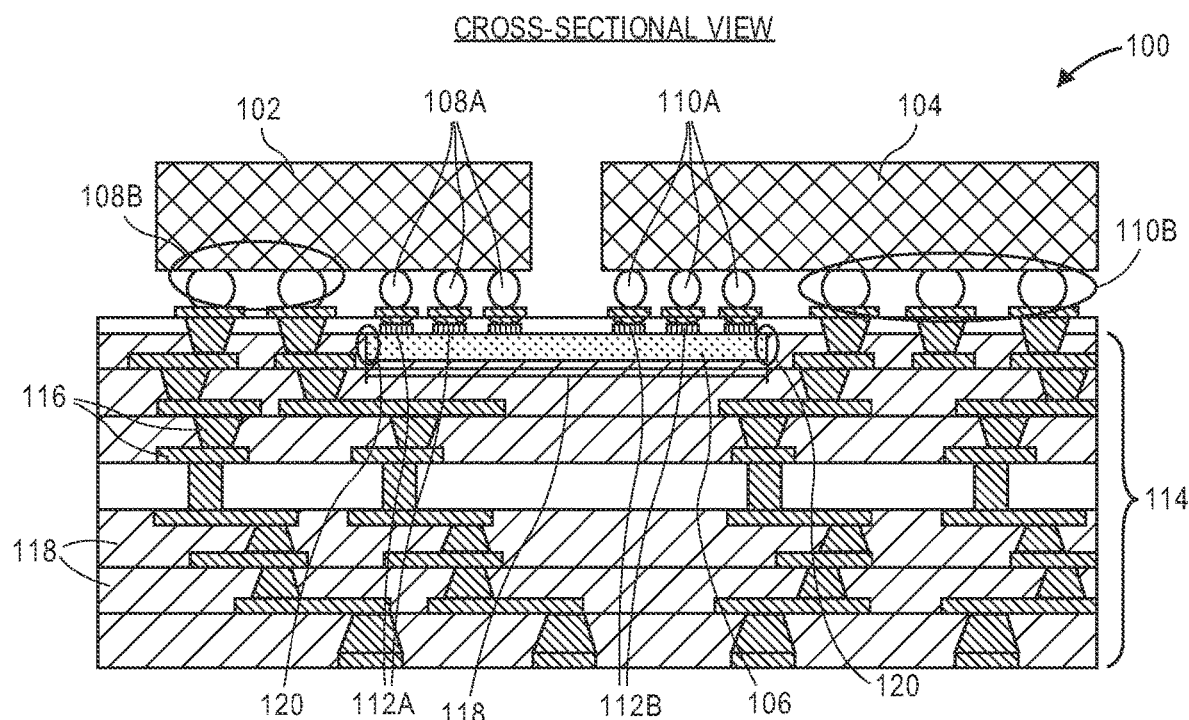
FIG. 1A illustrates a cross-sectional view of a semiconductor package having an Embedded Multi-Die Interconnection Bridge (EMIB) connecting two dies, in accordance with an embodiment of the present invention.

Guard ring designs enabling in-line testing of silicon bridges for semiconductor packages, and the resulting silicon bridges and semiconductor packages, are described. In the following description, numerous specific details are set forth, such as packaging and interconnect architectures, in order to provide a thorough understanding of embodiments of the present invention. It will be apparent to one skilled in the art that embodiments of the present invention may be practiced without these specific details. In other instances, well-known features, such as specific semiconductor fabrication processes, are not described in detail in order to not unnecessarily obscure embodiments of the present invention. Furthermore, it is to be understood that the various embodiments shown in the Figures are illustrative representations and are not necessarily drawn to scale.

One or more embodiments described herein are directed to guard ring designs for silicon (Si) bridges to enable in-line testing. Applications may be particularly useful for so-called 2.5D packaging designs. As used throughout the term "silicon bridge" is used to refer to a die providing routing for two or more device dies. The term "Embedded Multi-Die Interconnection Bridge (EMIB)" refers to the inclusion of such a silicon bridge die in a package substrate, or the resulting package. Embodiments may be implemented to solve issues surrounding detecting cross layer leakage in the Embedded Multi-Die Interconnection Bridge (EMIB) silicon using fab (factory) inline E-test pads. It is to be appreciated that cross layer leakage is difficult to detect using standard defect metrology and can often only be detected at Sort operation. However, for the fine pad pitches targeted by EMIB, the Sort technology often develops along with the other aspects of the process and availability of a Sort card for the development test chips or the first few lots of the lead product can be a challenge. In such scenarios, inline E-test capability can be used to provide coverage to detect such fail modes.

To provide context, in state-of-the-art Embedded Multi-Die Interconnection Bridge (EMIB) technology, cross layer leakage is only detected at Sort or not detected at all until post assembly test/failure analysis (FA) if a Sort card is unavailable. In addition, without detailed FA, the failing interfaces are difficult to determine. Embodiments of the present invention can be implemented to provide additional coverage and also monitor the leakage inline in Fab after each process operation. Such an approach can enable early detection and root cause identification of any underlying issues, lending to improving overall yield. That is, monitoring in-line during silicon bridge fabrication provides the ability to monitor wafer quality well before Sort and FA. Testing for defects in silicon bridge manufacturing is implemented using in-line E-test tools in fab as opposed to testing after fab processes are completed. Also, fine pitches of sophisticated products may be more suited for testing in-line. It is to be appreciated that state-of-the-art products presently have some E-test pads but not for detecting failure modes in an active region of a silicon bridge die.

Addressing one or more of the above described issues, embodiments described herein are directed to fabricating testable E-test pads near the scribe area. Signals and ground planes from the active die can be routed and tested without compromising overall quality of the silicon. In an embodiment, regardless of the specific implementations described below, a staggered guard ring is used to allow test signal routing to pass through a guard ring structure. In an embodiment, also regardless of the specific implementations described below, guard ring designs described herein are referred to as dual guard ring structures since they include at least an inner guard ring and an outer guard ring at an outermost perimeter of the silicon bride dies, i.e., near the scribe region.

Providing a high level overview of the concepts described herein, FIG. 1A illustrates a cross-sectional view of a semiconductor package having an Embedded Multi-Die Interconnection Bridge (EMIB) connecting two dies, in accordance with an embodiment of the present invention. Referring to FIG. 1A, a semiconductor package 100 includes a first die 102 (e.g., a memory die) and a second die 104 (e.g., a logic, CPU or SoC die). The first die 102 and second die 104 are coupled to a silicon bridge 106 through bumps 108A and 110A of the first die 102 and second die 104, respectively, and bond pads 112A and 112B (also referred to as conductive pads 112A and 112B) of the silicon bridge 106, e.g., by thermal compression bonding (TCB).

Figure 1B:
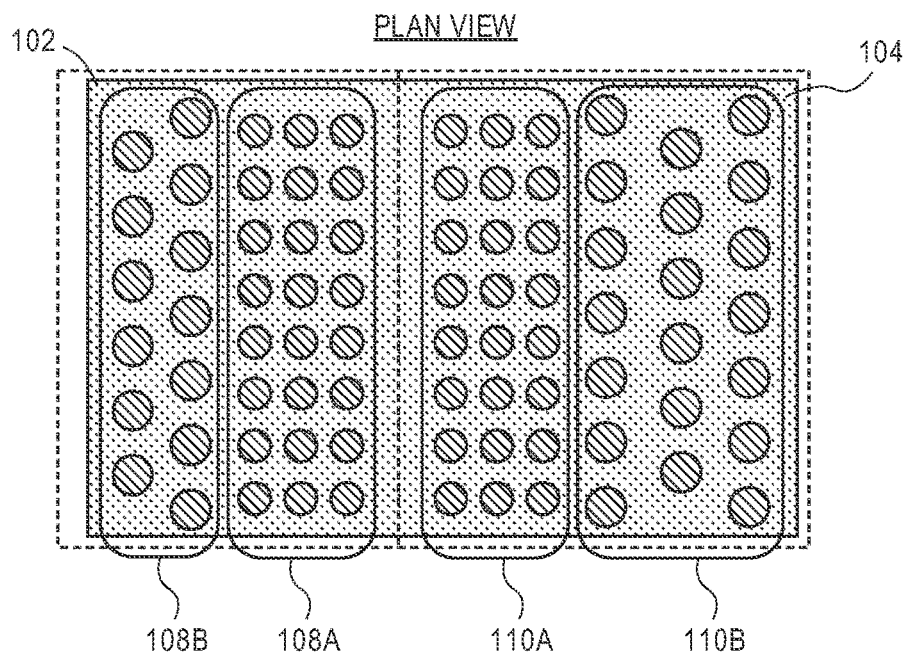
FIG. 1B illustrates a plan view showing the bump arrays of the first and second dies of FIG. 1A, in accordance with an embodiment of the present invention.

The first die 102 and second die 104 are disposed on a package substrate 114. The package substrate 114 includes metallization layers 116 (e.g., vertical arrangement of lines and vias) formed in insulating layers 118. The metallization layers 116 layers may be simple or complex and may be for coupling to other packages or may form part or all of an organic package or printed circuit board (PCB), etc. The first die 102 and second die 104 may each be coupled directly to the package substrate 114 through bumps 108B and 110B, respectively, as is depicted in FIG. 1A. FIG. 1B illustrates a plan view showing the bump arrays 108A, 108B, 110A and 110B of the first 102 and second 104 dies of FIG. 1A.

Referring again to FIG. 1A, the silicon bridge 106 as depicted is referred to as an Embedded Multi-Die Interconnection Bridge (EMIB) since it is included with the layers of the package substrate 114. In another embodiment, such a silicon bridge 106 is not embedded in the package, but rather in an open cavity of a substrate or board. In either case, in an embodiment, and as will be described in greater detail below, the silicon bridge 106 includes a silicon substrate having an insulating layer disposed thereon, the silicon substrate having a perimeter 118. A metallization structure is disposed on the insulating layer. The metallization structure includes conductive routing disposed in a dielectric material stack. The silicon bridge 106 also includes an inner metal guard ring disposed in the dielectric material stack and surrounding the conductive routing. An outer metal guard ring of the silicon bridge 106 is disposed in the dielectric material stack and surrounds the first metal guard ring. Test pads for signal lines and for VSS lines are included and are surrounded by at least the outer metal guard ring. In an embodiment, the silicon bridge 106 further includes a metal-free region 120 of the dielectric material stack. The metal-free region 120 surrounds the outer metal guard ring and is disposed adjacent to the outer metal guard ring and adjacent to the perimeter 118 of the substrate of the silicon bridge 106.

As described in greater detail below in association with FIG. 4, in one embodiment, the inner metal guard ring of the silicon bridge 106 is a first metal guard ring disposed in the dielectric material stack and surrounding the conductive routing. The first metal guard ring has a plurality of individual guard ring segments. The outer guard ring of the silicon bridge 106 is a second metal guard ring disposed in the dielectric material stack and surrounding the first metal guard ring. The test pads of the silicon bridge 106 are disposed between the first metal guard ring and the second metal guard ring. Additionally, the test pads are coupled to the conductive routing of the silicon bridge 106 by metal lines passing through the first metal guard ring.

As described in greater detail below in association with FIG. 5, in another embodiment, the inner metal guard ring of the silicon bridge 106 is a first continuous metal guard ring disposed in the dielectric material stack and surrounding the conductive routing. The outer guard ring of the silicon bridge 106 is a second continuous metal guard ring disposed in the dielectric material stack. The outer guard ring surrounds a first portion the first continuous metal guard ring at a first distance from the first continuous metal guard ring. The outer guard ring also surrounds a second portion of the first continuous metal guard ring at a second distance smaller than the first distance. The test pads of the silicon bridge 106 are disposed between the second portion of the first continuous metal guard ring and the metallization structure, the test pads coupled to the conductive routing.

Referring again to FIG. 1A, the first 102 and second 104 adjacent semiconductor dies are disposed on the semiconductor package substrate 114 and electrically coupled to one another by the conductive routing of the metallization structure of the silicon bridge 106. In one embodiment, the first semiconductor die 102 is a memory die, and the second semiconductor die 104 is a logic die. The first semiconductor die 102 is attached to the first plurality of conductive pads 112A of the silicon bridge 106, and the second semiconductor die 104 is attached to the second plurality of conductive pads 112B of the silicon bridge 106. In one embodiment, the conductive routing of the silicon bridge 106 electrically couples the first plurality of conductive pads 112A with the second plurality of conductive pads 112B.

As described above, a plurality of silicon bridge dies may be fabricated on a common silicon wafer which ultimately requires dicing to provide singulated silicon bridge dies. As an example, FIG. 2 illustrates a plan view of a portion of a silicon wafer having a plurality of silicon bridge dies fabricated thereon, in accordance with an embodiment of the present invention.

Figure 2:
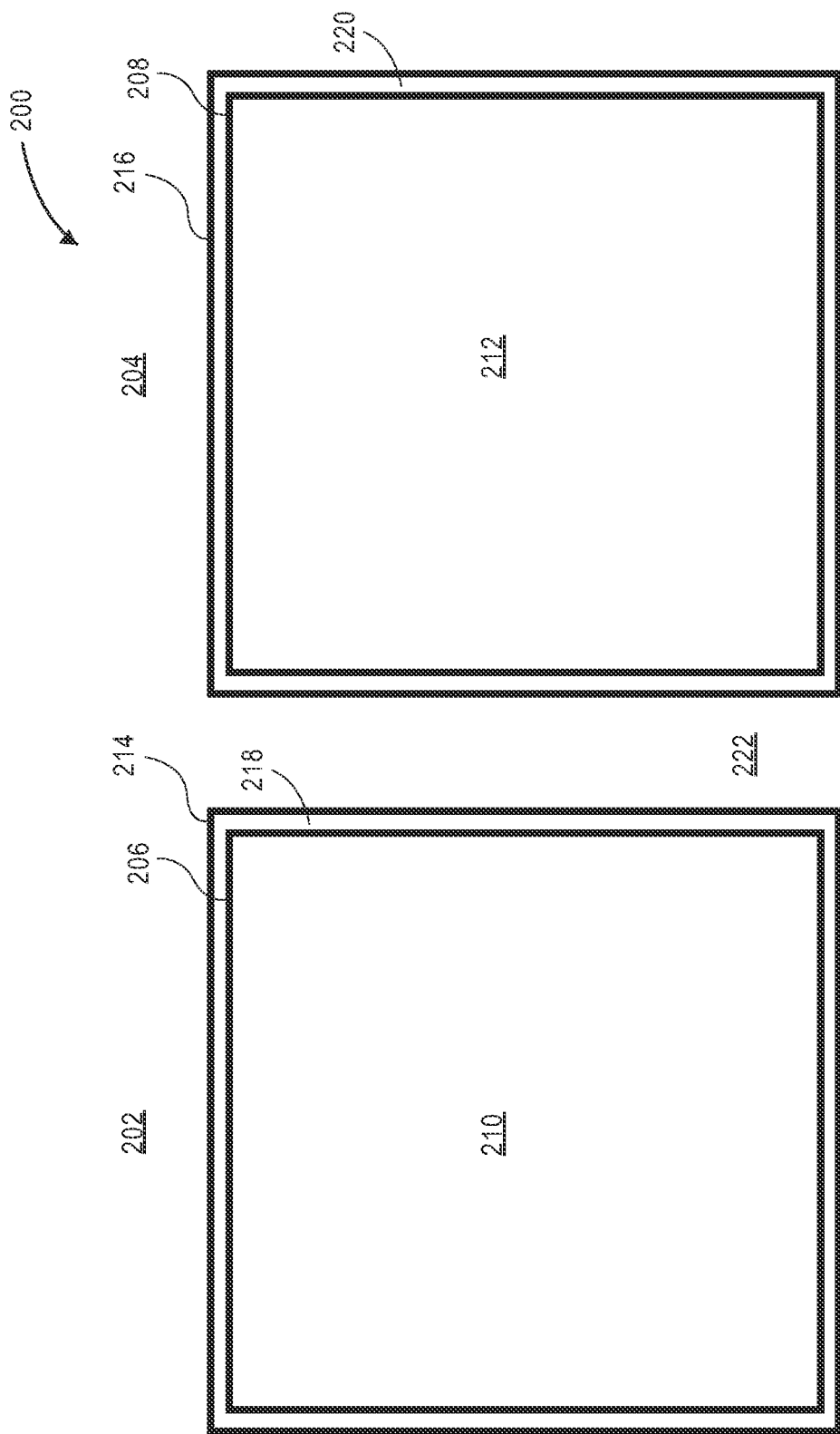
FIG. 2 illustrates a plan view of a portion of a silicon wafer having a plurality of silicon bridge dies fabricated thereon, in accordance with an embodiment of the present invention.

Referring to FIG. 2, a portion 200 of a silicon wafer includes a first silicon bridge die 202 and a second silicon bridge die 204 thereon. A first metal guard ring 206 or 208 surrounds an active region 210 or 212 of the first 202 and second 204 silicon bridge dies, respectively. A second metal guard ring 214 or 216 surrounds the first metal guard ring 206 or 208, respectively. A region 218 or 220 for various metallization features such as electrical testing (E-test) features is housed included at least within the second guard ring 214 or 216, respectively, as will be described in greater detail below. A metal-free scribe line 222 separates the first 202 and second 204 silicon bridge dies, outside the second guard rings 214 or 216, respectively. It is noted that in FIG. 2, only two silicon bridge dies are depicted. However, it is to be appreciated that a wafer or reticle can include a greater number of silicon bridge dies depending upon the wafer or reticle size and depending on the die size.

In an embodiment, the active die region 210 or 212 of FIG. 2 includes all of the signal and power/ground interconnects, allowing metal-free scribe line 222 in the dicing streets between dies. As a more detailed example, FIG. 3 illustrates a magnified layout for a dual guard ring design of FIG. 2 highlighting test structures fabricated within dual guard ring structure, in accordance with an embodiment of the present invention.

Figure 3:
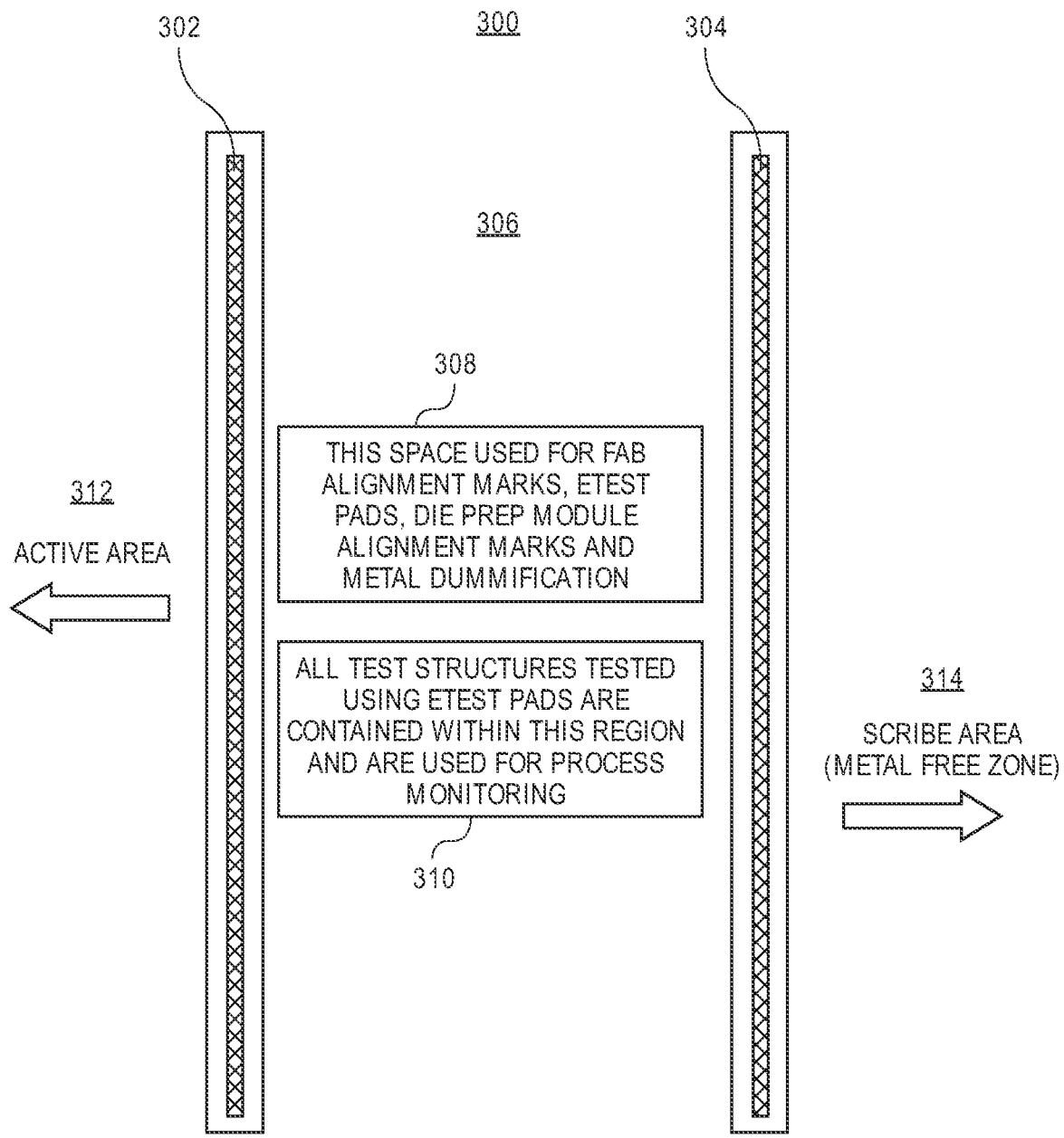
FIG. 3 illustrates a magnified layout for a dual guard ring design of FIG. 2 highlighting test structures fabricated within dual guard ring structure, in accordance with an embodiment of the present invention.

Referring to FIG. 3, a portion 300 of a silicon bridge die includes an inner guard ring 302 and an outer guard ring 304. A region 306 between guard rings 302 and 304 is used to place all the fab alignment/metrology 308 and E-test/EM structures 310. For example, region 308 represents a space used for fab alignment marks, E-test pads, die preparation module alignment marks, and metal dummification. Region 310 represents a space used of all test structures tested using E-test pads that are used for process monitoring, such as in-line process monitoring.

Referring again to FIG. 3, an active area 312 of the silicon bride die 300 is included within the inner guard ring 302. A scribe area 314 (which may be a metal free zone) is included outside the outer guard ring 304. In an embodiment, the E-test/EM structures are entirely contained within region 306 and they do not cross over to the active region 312. Such as dual guard ring 302/304 may based on a metal 1/via 1/metal 2/via 2/metal 3/via 3/metal 4 (M1/V1/M2/V2/M3/V3/M4), as is described in greater detail below in association with FIGS. 9 and 10.

Referring again to FIG. 3, in an embodiment, such a dual guard ring frame design 302/304 enables a saw-only die singulation process for silicon bridge technology. The metal-free scribe line 314 width is suitable to permit a saw blade to cut silicon and dielectric layers (such as silicon oxide layers) without contacting copper (Cu) metal features. In an embodiment, the inner metal guard ring 302 and the outer metal guard ring 304 provide a hermetic seal for electrical routing included in active area 312 of the silicon bridge die 300. The inner metal guard ring 302 and outer metal guard ring 304 design may also prevent cracks initiated in the scribe area 314 from propagating into the active area 312 of the silicon bridge die 300.

In accordance with one or more embodiments of the present invention, two specific implementations of a dual guard ring design enabling in-line testing of silicon bridge dies are described below. Such implementations enable E-test pads that can test cross layer leakage across structures in the active die regions of silicon bridge dies during their fabrication.

In a first embodiment, the inner guard ring (i.e., the guard ring closest to the active die region of the silicon bridge die) is broken up. Structures of interest are routed to selected E-test pads. In addition, a second row of discontinuous metal/via trenches is included in a staggered configuration to compensate for the broken inner guard ring. This approach increases the length across which a crack must propagate before it can enter the active region. Depending on which layers are routed to the E-test pads, test leakage across such layers can be selectively tested inline. For example, FIG. 4 illustrates a first implementation of a dual guard ring design enabling in-line testing of silicon bridge dies, in accordance with an embodiment of the present invention.

Figure 4:
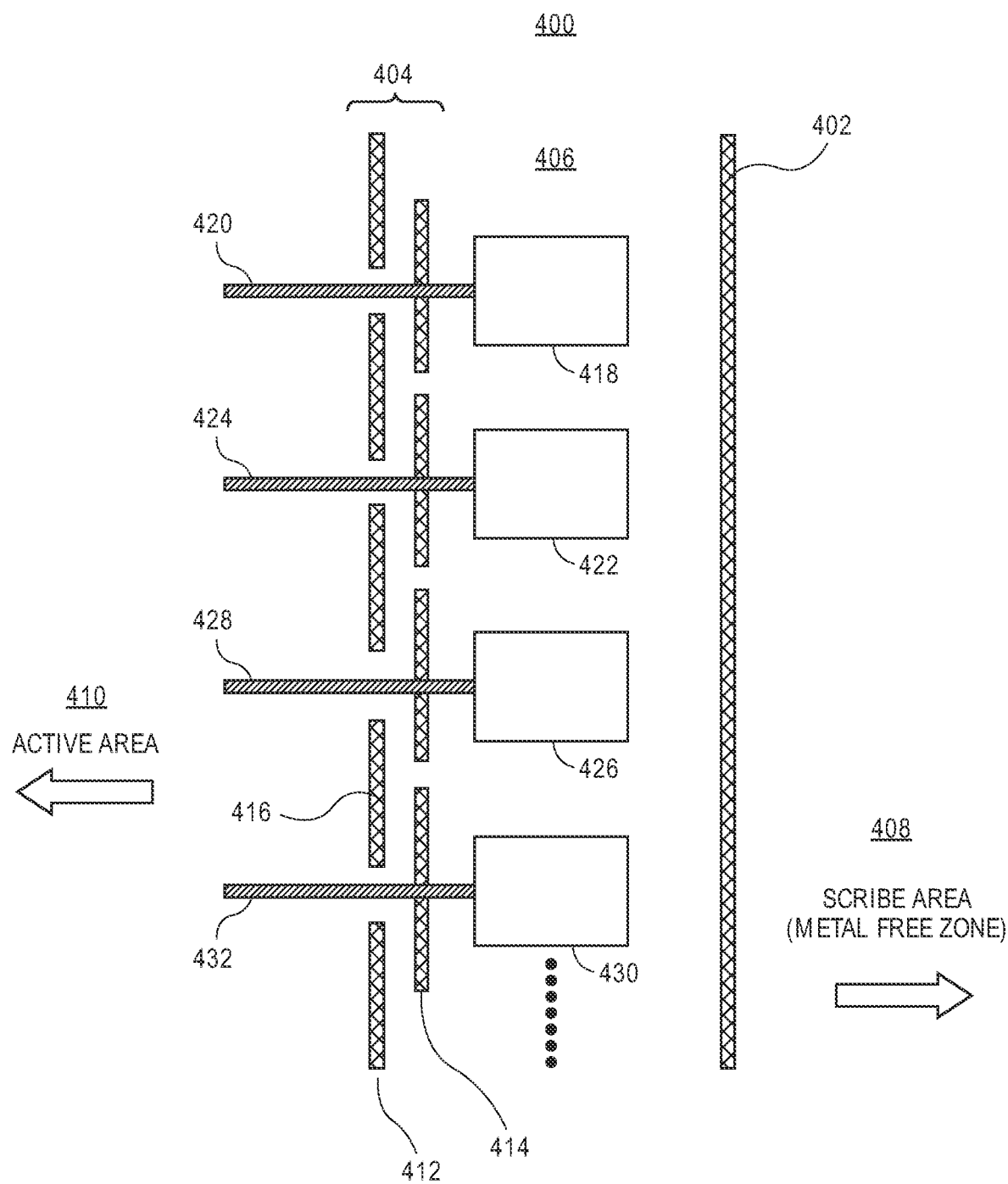
FIG. 4 illustrates a first implementation of a dual guard ring design enabling in-line testing of silicon bridge dies, in accordance with an embodiment of the present invention.

Referring to FIG. 4, a dual guard ring structure 400 is based on a staggered inner guard-ring with E-test pad routing where the inner guard ring is broken up, staggered, and signal/VSS from different layers is routed to test pads for leakage tests. The dual guard ring structure 400 includes an outer guard ring 402, an inner guard ring 404, and a region 406 between the outer guard ring 402 and the inner guard ring 404. A scribe area 408 (which may be a metal free zone) is outside the outer guard ring 402. An active area 410 is inside the inner guard ring 404.

In an embodiment, inner guard ring 404 includes a plurality of individual guard ring segments. For example, in one embodiment, inner guard ring 404 includes two lines 412 and 414 of staggered guard ring portions 416. This arrangement may be referred to as a plurality of individual guard ring segments of the inner metal guard ring 404 arranged in two adjacent lines of staggered individual guard ring segments. In an exemplary implementation, a signal 1 test pad 418 is included between the inner guard ring 404 and the outer guard ring 402, with a line 420 connecting the pad 418 to the active area 410 through the two lines 412 and 414 of staggered guard ring portions 416 of inner guard ring 404. A signal 2 test pad 422 is included between the inner guard ring 404 and the outer guard ring 402, with a line 424 connecting the pad 422 to the active area 410 through the two lines 412 and 414 of staggered guard ring portions 416 of inner guard ring 404. A signal 3 test pad 426 is included between the inner guard ring 404 and the outer guard ring 402, with a line 428 connecting the pad 426 to the active area 410 through the two lines 412 and 414 of staggered guard ring portions 416 of inner guard ring 404. A VSS test pad 430 is included between the inner guard ring 404 and the outer guard ring 402, with a line 432 connecting the pad 430 to the active area 410 through the two lines 412 and 414 of staggered guard ring portions 416 of inner guard ring 404.

In an embodiment, the scribe area 408 is a metal-free region of the dielectric material stack surrounding the outer metal guard ring 402. The metal-free region 408 is disposed adjacent to the outer metal guard ring 402 and adjacent to the perimeter of the substrate of the silicon bridge die. In one embodiment, the outer metal guard ring 402 provides a hermetic seal for the metallization structure of the active area 410. In one embodiment, the substrate is free from having semiconductor devices disposed therein. In one embodiment, the substrate is a single crystalline silicon substrate.

In a second embodiment, instead of breaking the inner guard ring, a portion of the inner guard ring is looped back behind the E-test pads, to provide a "continuous" dual guard-ring design as compared with the design of FIG. 4 which is based on a broken up inner guard ring. As an example, FIG. 5 illustrates a second implementation of a dual guard ring design enabling in-line testing of silicon bridge dies, in accordance with an embodiment of the present invention.

Figure 5:
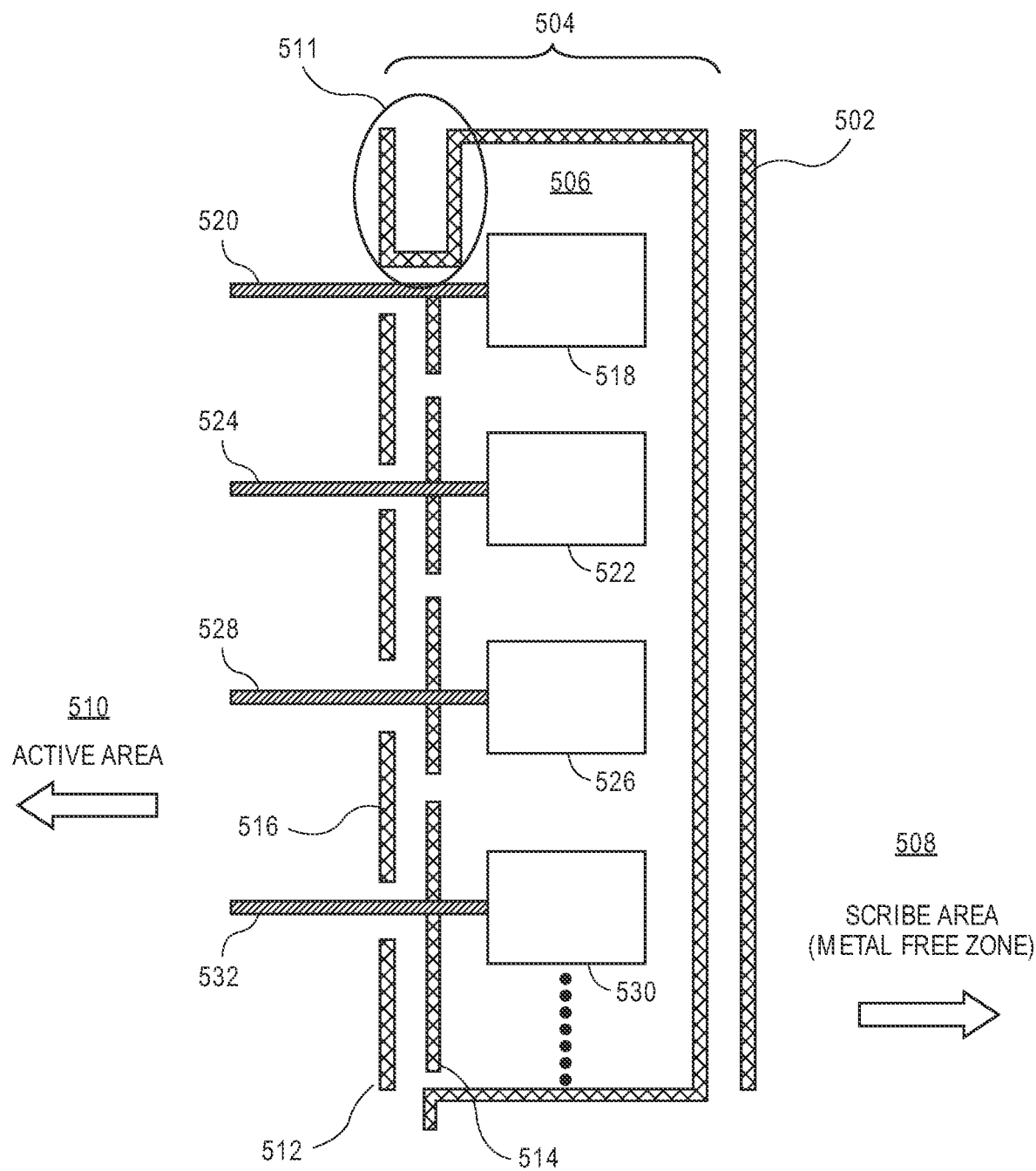
FIG. 5 illustrates a second implementation of a dual guard ring design enabling in-line testing of silicon bridge dies, in accordance with an embodiment of the present invention.

Referring to FIG. 5, a dual guard ring structure 500 is based on a "looped back" inner guard ring where the inner guard ring is both broken up and wrapped around the test pads, e.g., to improve hermetic sealing, and the signal/VSS from different layers can be routed to test pads for leakage tests. The dual guard ring structure 500 includes an outer guard ring 502, an inner guard ring 504. The inner guard ring 504 may be described as a first continuous metal guard ring with a portion 511 that is between a region 506 and an active region 510. However, to maintain continuity, the inner guard ring 504 loops behind the region 506 at locations where certain in-line test features are located. The outer guard ring may be described as a second continuous metal guard ring that surrounds a first portion (at location 511) of the first continuous metal guard ring 504 at a first distance from the first continuous metal guard ring 504. The outer guard ring 502 surrounds a second portion (portion looped back around region 506) of the first continuous metal guard ring at a second distance smaller than the first distance. A scribe area 508 (which may be a metal free zone) is outside the outer guard ring 502. An active area 510 is inside the inner guard ring 504.

In one embodiment, electrical testing features are disposed between the second portion of the first continuous metal guard ring 504 and a plurality of individual guard ring segments 516 arranged in two adjacent lines 512 and 514 of staggered individual guard ring segments 516 (i.e., the electrical testing features are disposed in region 506. In an exemplary implementation, a signal 1 test pad 518 is included in region 506, with a line 520 connecting the pad 518 to the active area 510 through the two lines 512 and 514 of staggered guard ring portions 516. A signal 2 test pad 522 is included in region 506, with a line 524 connecting the pad 522 to the active area 510 through the two lines 512 and 514 of staggered guard ring portions 516. A signal 3 test pad 526 is included in region 506, with a line 528 connecting the pad 526 to the active area 510 through the two lines 512 and 514 of staggered guard ring portions 516 of inner guard ring 504. A VSS test pad 530 is included in region 506, with a line 532 connecting the pad 530 to the active area 510 through the two lines 512 and 514 of staggered guard ring portions 516.

In an embodiment, the scribe area 508 is a metal-free region of the dielectric material stack surrounding the outer metal guard ring 502. The metal-free region 508 is disposed adjacent to the outer metal guard ring 502 and adjacent to the perimeter of the substrate of the silicon bridge die. In one embodiment, one or both of the inner guard ring 504 and the outer metal guard ring 502 provides a hermetic seal for the metallization structure of the active area 510. In one embodiment, the substrate is free from having semiconductor devices disposed therein. In one embodiment, the substrate is a single crystalline silicon substrate.

In accordance with an embodiment of the present invention, a dual guard ring design enabling in-line testing of silicon bridge dies will retain a region where e-test structures exist post saw cut (singulation). That is, singulation does not destroy the dual guard ring region. As an example, FIG. 6 illustrates a plan view of a portion of a silicon wafer from FIG. 2 highlighting artifacts of implementations described herein, in accordance with an embodiment of the present invention.

Figure 6:
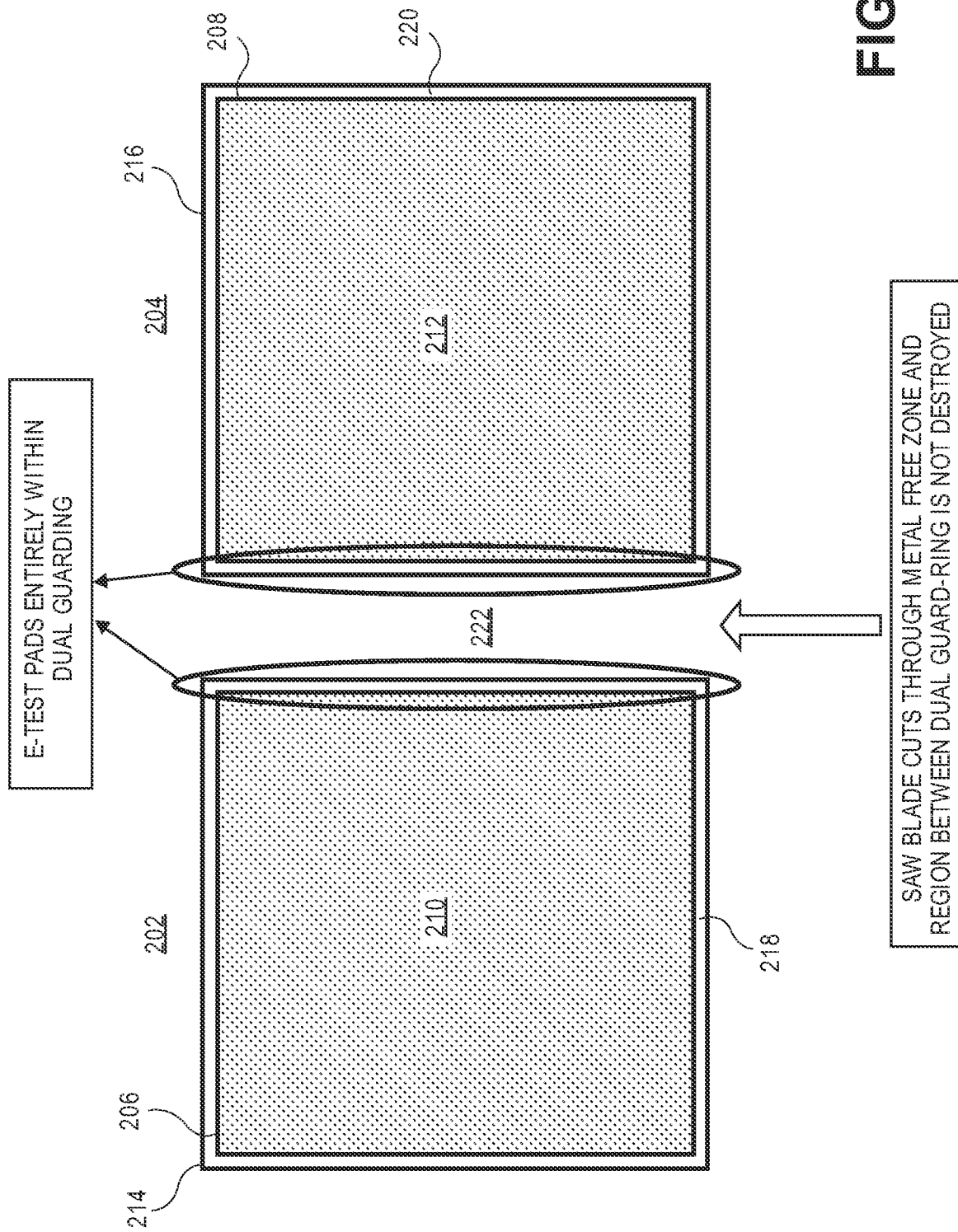
FIG. 6 illustrates a plan view of a portion of a silicon wafer from FIG. 2 highlighting artifacts of implementations described herein, in accordance with an embodiment of the present invention.

Referring to FIG. 6, a portion 200 of a silicon wafer includes a first silicon bridge die 202 and a second silicon bridge die 204 thereon. A first metal guard ring 206 or 208 surrounds an active region 210 or 212 of the first 202 and second 204 silicon bridge dies, respectively. A second metal guard ring 214 or 216 surrounds the first metal guard ring 206 or 208, respectively. A region 218 or 220 for various metallization features such as electrical testing (E-test) features is housed included at least within the second guard ring 214 or 216, respectively, as will be described in greater detail below. A metal-free scribe line 222 separates the first 202 and second 204 silicon bridge dies, outside the second guard rings 214 or 216, respectively. The E-test pads are included entirely within dual guard ring structure. Accordingly, a singulation process involving a saw blade cutting through the metal free zone 222 leaves the region between the dual guard ring structure intact. The resulting singulated dies include such E-test pads within the dual guard ring structure post saw cut.

Figure 7:
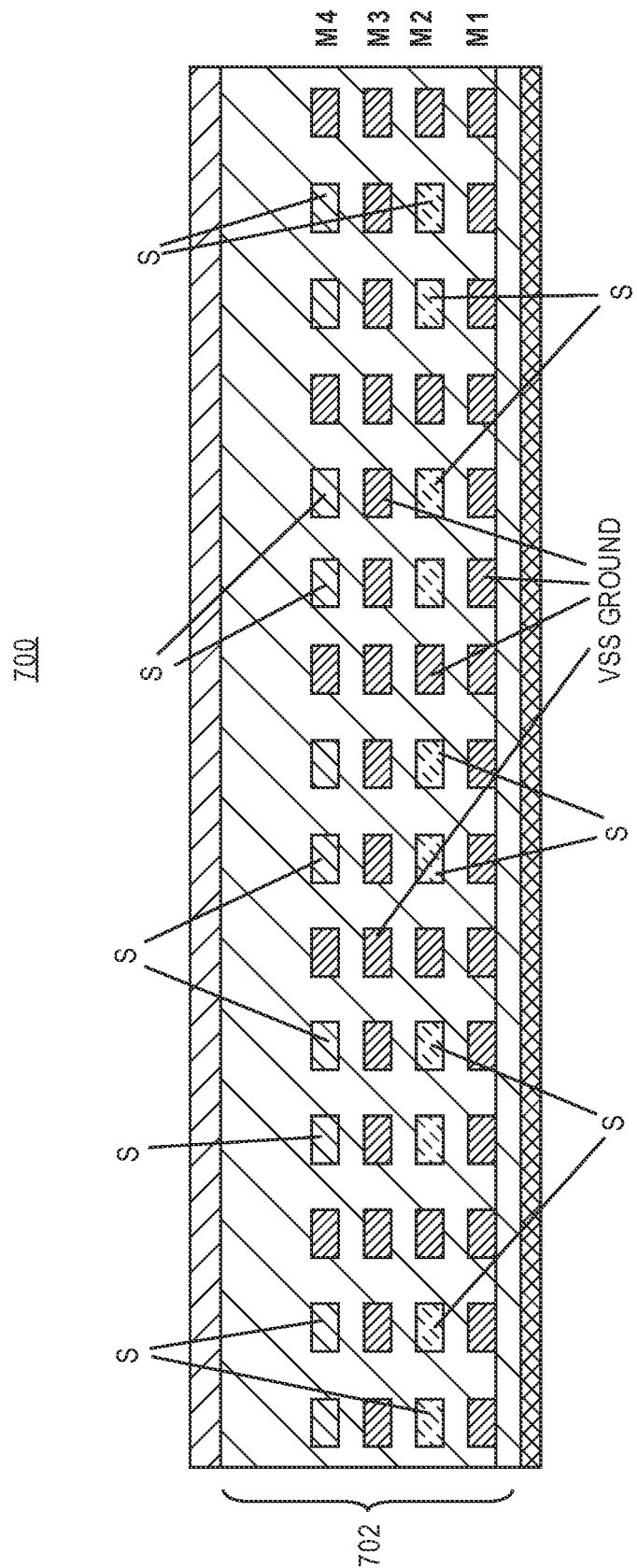
FIG. 7 illustrates a cross-sectional view of a possible E-test routing layout for a silicon bridge die, in accordance with an embodiment of the present invention.

FIG. 7 illustrates a cross-sectional view of a possible E-test routing layout 700 for a silicon bridge die, in accordance with an embodiment of the present invention. In the exemplary layout 700, a metallization region 702 utilizes metal 1 and metal 3 (M1/M3) for VSS ground routing. The metallization region 702 further utilizes metal 2 and metal 4 (M2/M4) for signal routing.

Figure 8:
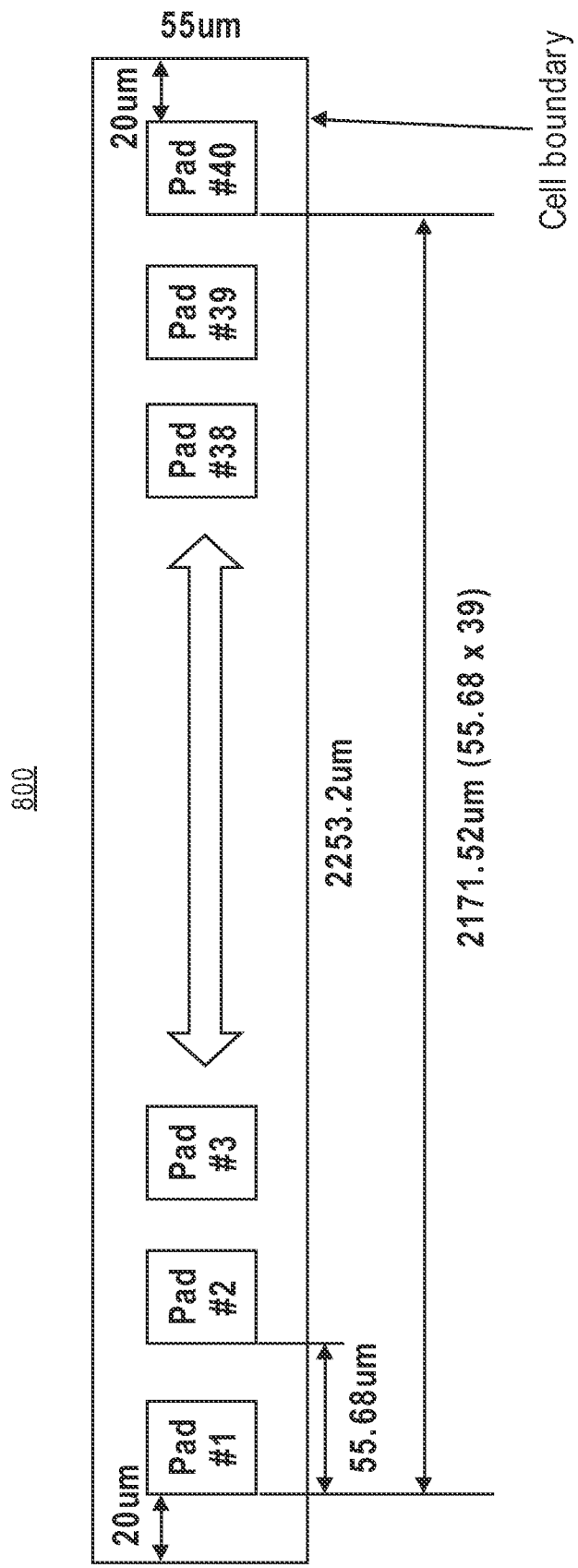
FIG. 8 is a schematic layout of an E-test spline for a silicon bridge die, in accordance with an embodiment of the present invention.

FIG. 8 is a schematic layout of an E-test spline 800 for a silicon bridge die, in accordance with an embodiment of the present invention. In the exemplary spline 800, each E-test Spline has 40 E-test pads with dimensions of 41.68 micron× 49 micron pad size, a pad pitch of 55.68 micron (based on 14 micron spacing). The cell size is 2253.2 micron×55 micron. In an embodiment, cell placement is horizontal (based on wafer notch down orientation).

Figure 9:
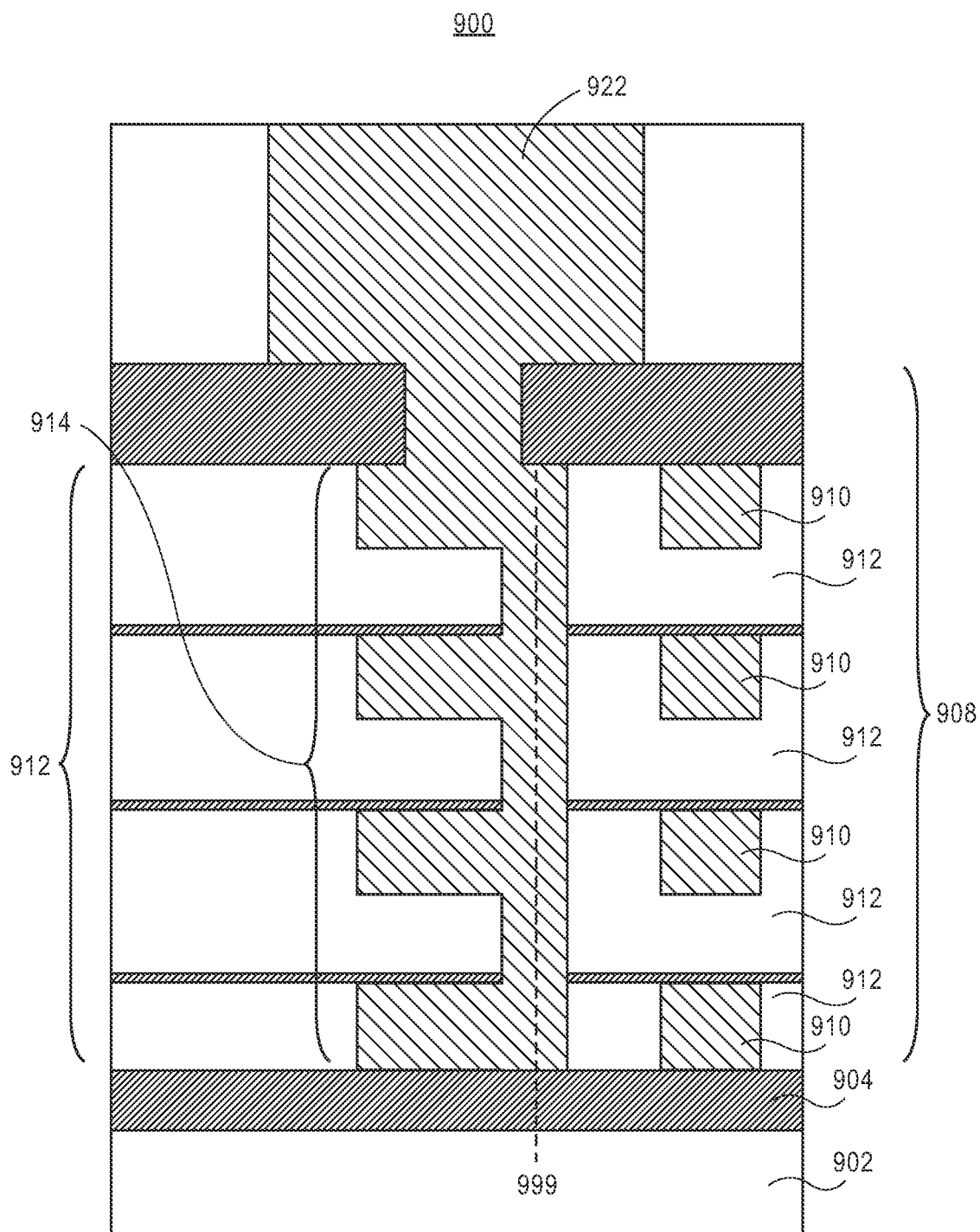
FIG. 9 illustrates a cross-sectional view of a guard ring of a dual guard ring structure, in accordance with an embodiment of the present invention.
Figure 10:
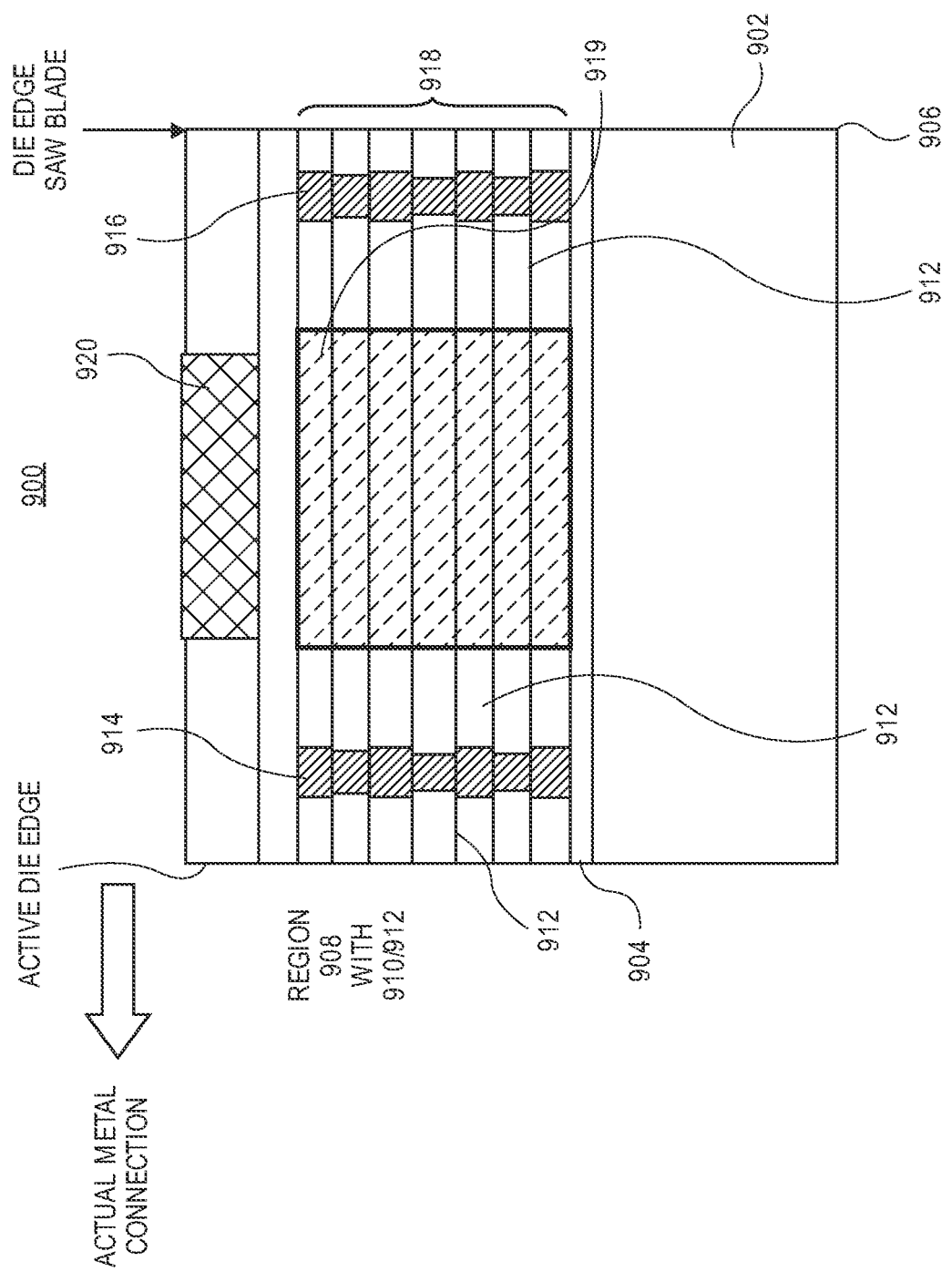
FIG. 10 illustrates a cross-sectional view of a dual guard ring structure, in accordance with an embodiment of the present invention.

It is to be appreciated that a dual guard ring structure may be fabricated from a plurality of layers of a metallization structure, such as from a plurality of alternating metal lines and vias. As an example, FIG. 9 illustrates a cross-sectional view of a guard ring of a dual guard ring structure, in accordance with an embodiment of the present invention. FIG. 10 illustrates a cross-sectional view of a dual guard ring structure, in accordance with an embodiment of the present invention.

Referring to FIGS. 9 and 10 collectively, in an embodiment, a semiconductor structure 900 (such as a silicon bridge) includes a substrate 902 having an insulating layer disposed thereon 904. The substrate has a perimeter 906, an outer most portion of which is depicted on the right-hand side of FIG. 10. A metallization structure 908 is disposed on the insulating layer 904. The metallization structure 908 includes conductive routing 910 disposed in a dielectric material stack 912.

A first metal guard ring 914 is disposed in the dielectric material stack 912 and surrounds the conductive routing 910. A second metal guard ring 916 (only shown in FIG. 10) is disposed in the dielectric material stack 912 and surrounds the first metal guard ring 914. A metal-free region 918 of the dielectric material stack 912 surrounds the second metal guard ring 916 (only shown in FIG. 10). The metal-free region 918 is disposed adjacent to the second metal guard ring 916 and adjacent to the perimeter 906 of the substrate 902.

In an embodiment, at least one of the first metal guard ring 914 or the second metal guard ring 916 includes a vertical stack of alternating metal lines and vias aligned along a common axis 999, as is depicted in FIG. 9. In one embodiment, an uppermost layer of the metallization structure includes first and second pluralities of conductive pads thereon, such as pad 922 shown in FIG. 9 (although it is to be appreciated that the pad may be omitted from the guard ring structure even if included in the metallization of the active die region). In one such embodiment, the conductive routing electrically couples a first plurality of conductive pads with a second plurality of conductive pads of the silicon bridge. In one embodiment, the first and second pluralities of conductive pads include a layer of copper having a thickness of greater than approximately 5 microns.

In one embodiment, the semiconductor structure includes metal features 919 disposed in the dielectric material stack, between the first metal guard ring 914 and the second metal guard ring 916. Additionally, an E-test pad 920 may be included between the first metal guard ring 914 and the second metal guard ring 916, as is depicted in FIG. 10. In an embodiment, the substrate 902 is free from having semiconductor devices disposed therein. That is, the primary function of the silicon bridge die is to provide local and direct communication between two dies coupled to the silicon bridge die. In one embodiment, the substrate is a single crystalline silicon substrate.

Figure 11:
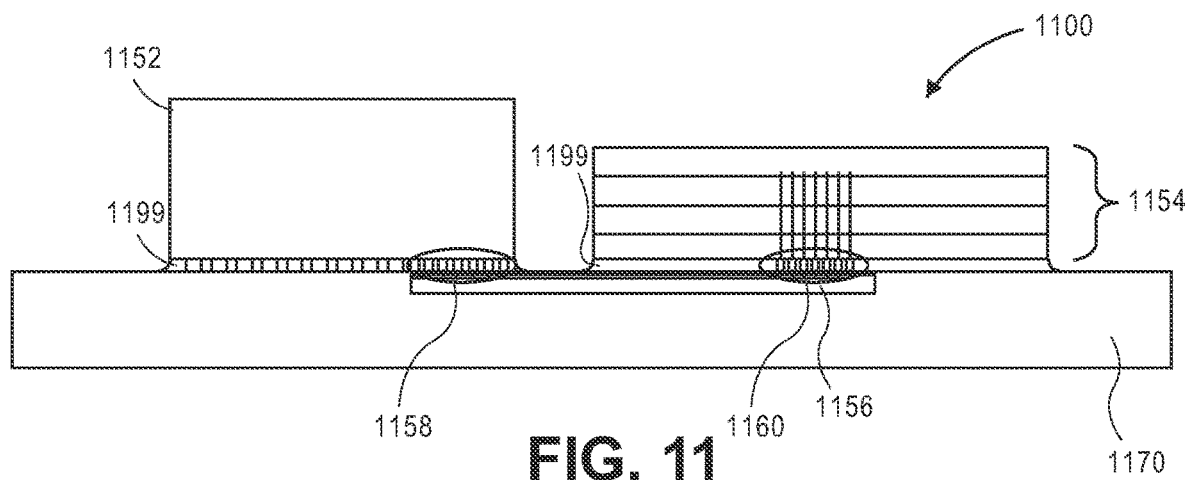
FIG. 11 illustrates a cross-sectional view of a semiconductor package including multiple die coupled with an Embedded Multi-Die Interconnection Bridge (EMIB), in accordance with an embodiment of the present invention.

Although the above describe embodiments are directed to two individual dies coupled to one another by a silicon bridge or EMIB, it is to be appreciated that complex structure may also benefit from embodiments described herein. In a first example, FIG. 11 illustrates a cross-sectional view of a semiconductor package including multiple die coupled with an Embedded Multi-Die Interconnection Bridge (EMIB), in accordance with an embodiment of the present invention. Referring to FIG. 11, the semiconductor package 1100 includes a first die 1152 (such as a logic die central processing unit, CPU) and a memory die stack 1154. The first die 1152 and the memory die stack 1154 are coupled to an EMIB 1156 through bumps 1158 and 1160 of the first die 1152 and the memory die stack 1154, respectively, e.g., by thermal compression bonding (TCB). The EMIB 1156 is embedded in a substrate (e.g., a flexible organic substrate) or board (such as an epoxy PCB material) material 1170. An underfill material 1199 may be included between the first die 1152 and the EMIB 1156/substrate 1170 interface and between the memory die stack 1154 and the EMIB 1156/substrate 1170 interface, as is depicted in FIG. 11. In an embodiment, the EMIB 1156 includes a dual metal guard ring surrounded by a metal free portion outside of the outermost metal guard ring with electrical testing features housed within the outermost metal guard ring, as described above.

Figure 12:
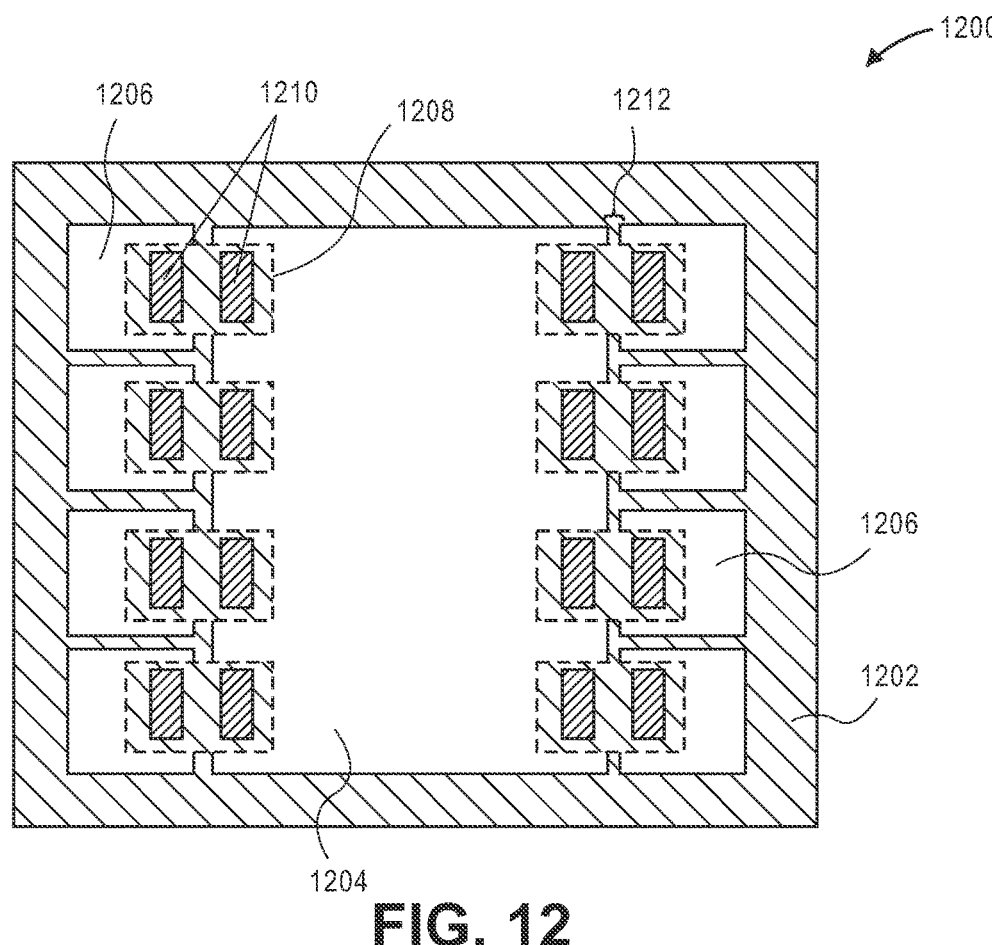
FIG. 12 illustrates a plan view of a package layout for co-packaged high performance computing (HPC) die and high bandwidth memory (HBM) layout, in accordance with an embodiment of the present invention.

In a second example, FIG. 12 illustrates a plan view of a package layout for co-packaged high performance computing (HPC) die and high bandwidth memory (HBM) layout, in accordance with an embodiment of the present invention. Referring to FIG. 12, a package layout 1200 includes a common substrate 1202. A central processing unit or system-on-chip (CPU/SoC) die 1204 is supported by the substrate 1202 along with eight memory dies 1206. A plurality of EMIBs 1208 bridge the memory dies 1206 to the CPU/SoC die 1204 by C4 connections 1210. The die-to-die spacing 1212 is approximately 100-200 microns. It is to be appreciated that, from a top-down view perspective, the dies 1204 and 1206 are disposed above the C4 connections 1210, which are disposed above the EMIBs 1208, which are included in the substrate 1202. In an embodiment, one or more of the EMIBs 1208 includes a dual metal guard ring surrounded by a metal free portion outside of the outermost metal guard ring, with electrical testing features housed within the outermost metal guard ring, as described above.

As described above, in an embodiment, a substrate for a silicon bridge may be a single crystalline silicon substrate. In other embodiments, and still in the context of a "silicon bridge," the substrate may be composed of a multi- or single-crystal of a material which may include, but is not limited to, germanium, silicon-germanium or a Group III-V compound semiconductor material. In another embodiment, a glass substrate is used.

Referencing the above description regarding silicon bridge technology, in an embodiment, an insulating, dielectric or interlayer dielectric (ILD) material is one such as, but not limited to, oxides of silicon (e.g., silicon dioxide ($SiO_2$)), doped oxides of silicon, fluorinated oxides of silicon, carbon doped oxides of silicon, various low-k dielectric materials known in the arts, and combinations thereof. The insulating, dielectric or interlayer dielectric (ILD) material may be formed by conventional techniques, such as, for example, chemical vapor deposition (CVD), physical vapor deposition (PVD), or by other deposition methods.

Referencing the above description regarding silicon bridge technology, in an embodiment, interconnect or conductive routing material is composed of one or more metal or other conductive structures. A common example is the use of copper lines and structures (such as vias) that may or may not include barrier layers between the copper and surrounding ILD material. As used herein, the term metal includes alloys, stacks, and other combinations of multiple metals. For example, the metal interconnect lines may include barrier layers, stacks of different metals or alloys, etc. The interconnect lines or conductive routing are also sometimes referred to in the arts as traces, wires, lines, metal, or simply interconnects. The dual metal guard ring designs described above may be fabricated from the same materials as the metallization structure and conductive routing.

In accordance with one or more embodiments described herein, a frame design for a wafer of silicon bridges dies includes, for each individual die, a first (outer) guard ring in close proximity to a saw cut area, providing initial protection during dicing. A second (inner) guard ring is located around the die edge. One or more cracks that propagate through the outer guard ring during (or after) a singulation process may be terminated between the inner and outer guard rings.

As described above, a plurality of silicon bridge dies may be fabricated from a common wafer. A method of fabricating a plurality of silicon bridge dies includes providing a wafer having a plurality of silicon bridge dies thereon. Each of the plurality of silicon bridge dies is separated from one another by metal-free scribe lines. The method of fabricating the plurality of silicon bridge dies includes singulating the plurality of silicon bridge dies by sawing the metal-free scribe lines of the wafer. In accordance with an embodiment of the present invention, each of the plurality of silicon bridge dies is protected by the dual metal guard ring during the sawing. In an embodiment, prior to the sawing, at an earlier stage in fabrication, the silicon bridge dies can be E-tested using test structures included within a dual guard ring structure.

In one embodiment, singulating the plurality of silicon bridge dies involves leaving a portion of the metal-free scribe lines to remain as a portion of each of the singulated plurality of silicon bridge dies. In one embodiment, at least one of the metal guard rings of the dual metal guard ring provides a hermetic seal for each of the plurality of silicon bridge dies during the sawing. In one embodiment, a crack is formed during the sawing the metal-free scribe lines of the wafer. In a particular embodiment, the crack propagates through an outermost metal guard ring of the dual metal guard ring but not through an inner most metal guard ring of the dual metal guard ring, even subsequent to the sawing process. This, in an embodiment, a dual metal guard ring design having a metal-free outermost region enables a saw-only die singulation process for silicon bridge technologies.

Embodiments describe above, upon implementation in a silicon bridge die fabrication process, can provide a more robust in-line method of detecting cross-layer leakage prior to assembly builds. A key benefit of embodiments described herein is to improve the overall yield of the EMIB silicon process by capturing cross-layer leakage defects in-line in fab so that substrate vendors and/or customers receive known good die.

Figure 13:
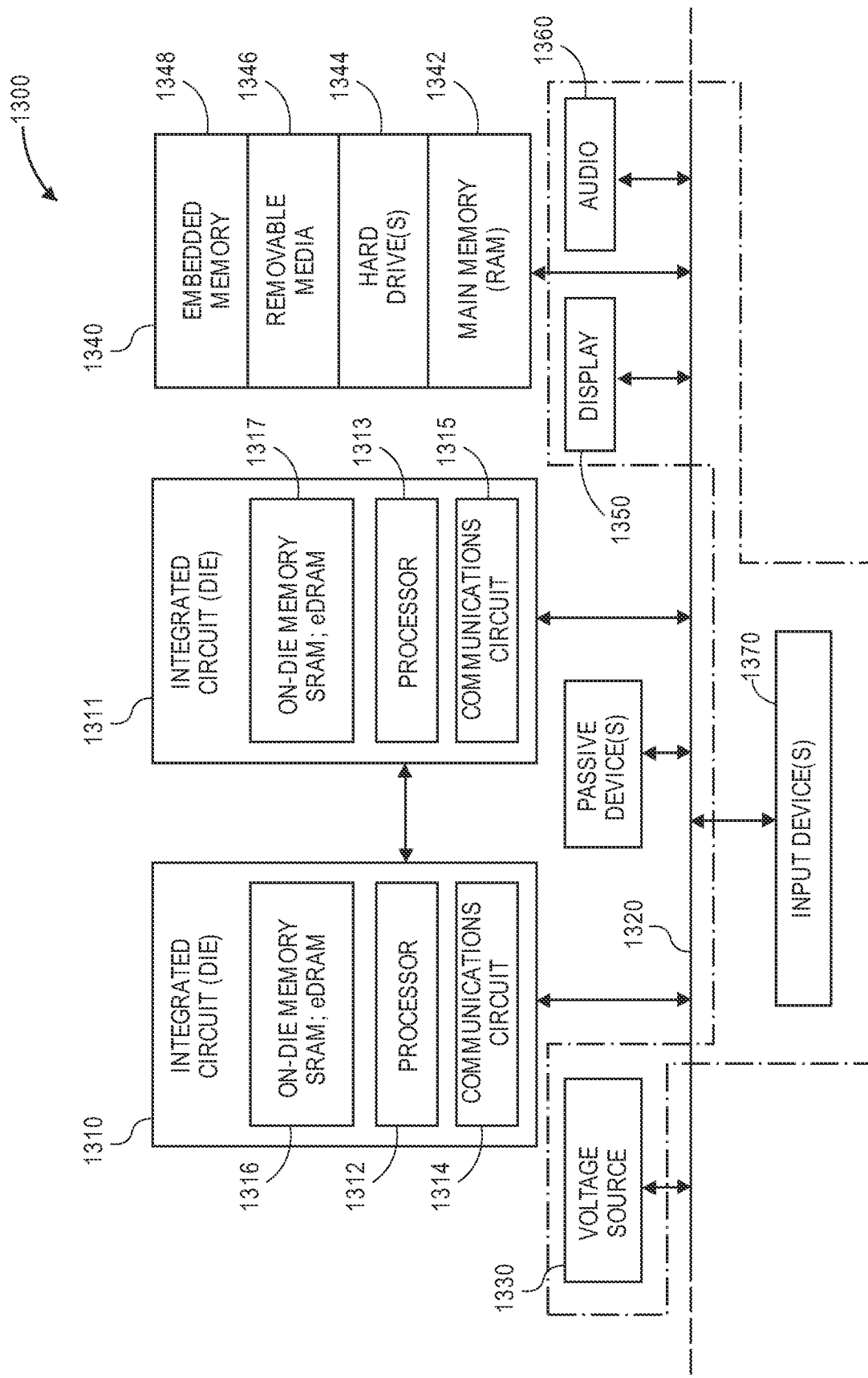
FIG. 13 is a schematic of a computer system, in accordance with an embodiment of the present invention.

FIG. 13 is a schematic of a computer system 1300, in accordance with an embodiment of the present invention. The computer system 1300 (also referred to as the electronic system 1300) as depicted can embody a silicon bridge having a dual guard ring design, according to any of the several disclosed embodiments and their equivalents as set forth in this disclosure. The computer system 1300 may be a mobile device such as a netbook computer. The computer system 1300 may be a mobile device such as a wireless smart phone. The computer system 1300 may be a desktop computer. The computer system 1300 may be a hand-held reader. The computer system 1300 may be a server system. The computer system 1300 may be a supercomputer or high-performance computing system.

In an embodiment, the electronic system 1300 is a computer system that includes a system bus 1320 to electrically couple the various components of the electronic system 1300. The system bus 1320 is a single bus or any combination of busses according to various embodiments. The electronic system 1300 includes a voltage source 1330 that provides power to the integrated circuit 1310. In some embodiments, the voltage source 1330 supplies current to the integrated circuit 1310 through the system bus 1320.

The integrated circuit 1310 is electrically coupled to the system bus 1320 and includes any circuit, or combination of circuits according to an embodiment. In an embodiment, the integrated circuit 1310 includes a processor 1312 that can be of any type. As used herein, the processor 1312 may mean any type of circuit such as, but not limited to, a microprocessor, a microcontroller, a graphics processor, a digital signal processor, or another processor. In an embodiment, the processor 1312 includes, or is coupled with, a silicon bridge having a dual guard ring design, as disclosed herein. In an embodiment, SRAM embodiments are found in memory caches of the processor. Other types of circuits that can be included in the integrated circuit 1310 are a custom circuit or an application-specific integrated circuit (ASIC), such as a communications circuit 1314 for use in wireless devices such as cellular telephones, smart phones, pagers, portable computers, two-way radios, and similar electronic systems, or a communications circuit for servers. In an embodiment, the integrated circuit 1310 includes on-die memory 1316 such as static random-access memory (SRAM). In an embodiment, the integrated circuit 1310 includes embedded on-die memory 1316 such as embedded dynamic random-access memory (eDRAM).

In an embodiment, the integrated circuit 1310 is complemented with a subsequent integrated circuit 1311. Useful embodiments include a dual processor 1313 and a dual communications circuit 1315 and dual on-die memory 1317 such as SRAM. In an embodiment, the dual integrated circuit 1310 includes embedded on-die memory 1317 such as eDRAM.

In an embodiment, the electronic system 1300 also includes an external memory 1340 that in turn may include one or more memory elements suitable to the particular application, such as a main memory 1342 in the form of RAM, one or more hard drives 1344, and/or one or more drives that handle removable media 1346, such as diskettes, compact disks (CDs), digital variable disks (DVDs), flash memory drives, and other removable media known in the art. The external memory 1340 may also be embedded memory 1348 such as the first die in a die stack, according to an embodiment.

In an embodiment, the electronic system 1300 also includes a display device 1350, an audio output 1360. In an embodiment, the electronic system 1300 includes an input device such as a controller 1370 that may be a keyboard, mouse, trackball, game controller, microphone, voice-recognition device, or any other input device that inputs information into the electronic system 1300. In an embodiment, an input device 1370 is a camera. In an embodiment, an input device 1370 is a digital sound recorder. In an embodiment, an input device 1370 is a camera and a digital sound recorder.

As shown herein, the integrated circuit 1310 can be implemented in a number of different embodiments, including a package substrate having a silicon bridge having a dual guard ring design, according to any of the several disclosed embodiments and their equivalents, an electronic system, a computer system, one or more methods of fabricating an integrated circuit, and one or more methods of fabricating an electronic assembly that includes a package substrate having a silicon bridge having a dual guard ring design, according to any of the several disclosed embodiments as set forth herein in the various embodiments and their art-recognized equivalents. The elements, materials, geometries, dimensions, and sequence of operations can all be varied to suit particular I/O coupling requirements including array contact count, array contact configuration for a microelectronic die embedded in a processor mounting substrate according to any of the several disclosed package substrates having a silicon bridge having a dual guard ring design embodiments and their equivalents. A foundation substrate may be included, as represented by the dashed line of FIG. 13. Passive devices may also be included, as is also depicted in FIG. 13.

Embodiments of the present invention include guard ring designs enabling in-line testing of silicon bridges for semiconductor packages, and the resulting silicon bridges and semiconductor packages.

In an embodiment, a semiconductor structure includes a substrate having an insulating layer disposed thereon. A metallization structure is disposed on the insulating layer. The metallization structure incudes conductive routing disposed in a dielectric material stack. The semiconductor structure also includes a first metal guard ring disposed in the dielectric material stack and surrounding the conductive routing. The first metal guard ring includes a plurality of individual guard ring segments. The semiconductor structure also includes a second metal guard ring disposed in the dielectric material stack and surrounding the first metal guard ring. Electrical testing features are disposed in the dielectric material stack, between the first metal guard ring and the second metal guard ring. The electrical testing features are coupled to the conductive routing by metal lines passing through the first metal guard ring.

In one embodiment, the electrical testing features include test pads for signal lines and for VSS lines.

In one embodiment, the plurality of individual guard ring segments of the first metal guard ring is arranged in two adjacent lines of staggered individual guard ring segments.

In one embodiment, the substrate has a perimeter, and the semiconductor structure further includes a metal-free region of the dielectric material stack surrounding the second metal guard ring. The metal-free region is disposed adjacent to the second metal guard ring and adjacent to the perimeter of the substrate.

In one embodiment, the second metal guard ring provides a hermetic seal for the metallization structure.

In one embodiment, at least one of the first metal guard ring or the second metal guard ring comprises a vertical stack of alternating metal lines and vias aligned along a common axis.

In one embodiment, an uppermost layer of the metallization structure comprises first and second pluralities of conductive pads thereon.

In one embodiment, the conductive routing electrically couples the first plurality of conductive pads with the second plurality of conductive pads.

In one embodiment, the substrate is free from having semiconductor devices disposed therein.

In one embodiment, the substrate is a single crystalline silicon substrate.

In an embodiment, a semiconductor structure includes a substrate having an insulating layer disposed thereon. A metallization structure is disposed on the insulating layer, the metallization structure including conductive routing disposed in a dielectric material stack. A first continuous metal guard ring is disposed in the dielectric material stack and surrounds the conductive routing. A second continuous metal guard ring is disposed in the dielectric material stack and surrounds a first portion the first continuous metal guard ring at a first distance from the first continuous metal guard ring, and surrounds a second portion of the first continuous metal guard ring at a second distance smaller than the first distance. Electrical testing features are disposed in the dielectric material stack, between the second portion of the first continuous metal guard ring and the metallization structure, the electrical testing features coupled to the conductive routing.

In one embodiment, the electrical testing features includes test pads for signal lines and for VSS lines.

In one embodiment, the electrical testing features are disposed between the second portion of the first continuous metal guard ring and a plurality of individual guard ring segments arranged in two adjacent lines of staggered individual guard ring segments, and the electrical testing features are coupled to the conductive routing by metal lines passing through the plurality of individual guard ring segments.

In one embodiment, the substrate has a perimeter, and the semiconductor structure further includes a metal-free region of the dielectric material stack surrounding the second continuous metal guard ring, the metal-free region disposed adjacent to the second continuous metal guard ring and adjacent to the perimeter of the substrate.

In one embodiment, one or both of the first continuous metal guard ring and the second continuous metal guard ring provides a hermetic seal for the metallization structure.

In one embodiment, at least one of the first metal guard ring or the second metal guard ring includes a vertical stack of alternating metal lines and vias aligned along a common axis.

In one embodiment, an uppermost layer of the metallization structure includes first and second pluralities of conductive pads thereon.

In one embodiment, the conductive routing electrically couples the first plurality of conductive pads with the second plurality of conductive pads.

In one embodiment, the substrate is free from having semiconductor devices disposed therein.

In one embodiment, the substrate is a single crystalline silicon substrate.

In an embodiment, a semiconductor package includes an Embedded Multi-Die Interconnection Bridge (EMIB) including a silicon bridge disposed within a semiconductor package substrate. The silicon bridge includes a silicon substrate having an insulating layer disposed thereon. The silicon bridge also includes a metallization structure disposed on the insulating layer, the metallization structure including conductive routing disposed in a dielectric material stack. The silicon bridge also includes an inner metal guard ring disposed in the dielectric material stack and surrounding the conductive routing. The silicon bridge also includes an outer metal guard ring disposed in the dielectric material stack and surrounding the first metal guard ring; and test pads for signal lines and for VSS lines, the test pads surrounded by at least the outer metal guard ring. The semiconductor structure also includes first and second adjacent semiconductor dies disposed on the semiconductor package substrate and electrically coupled to one another by the conductive routing of the metallization structure of the silicon bridge.

In one embodiment, the first semiconductor die is a memory die, and the second semiconductor die is a logic die.

In one embodiment, the inner metal guard ring of the silicon bridge is a first metal guard ring disposed in the dielectric material stack and surrounding the conductive routing, the first metal guard ring having a plurality of individual guard ring segments, where the outer guard ring of the silicon bridge is a second metal guard ring disposed in the dielectric material stack and surrounding the first metal guard ring, and where the test pads of the silicon bridge are disposed between the first metal guard ring and the second metal guard ring, the test pads coupled to the conductive routing by metal lines passing through the first metal guard ring.

In one embodiment, the inner metal guard ring of the silicon bridge is a first continuous metal guard ring disposed in the dielectric material stack and surrounding the conductive routing, where the outer guard ring of the silicon bridge is a second continuous metal guard ring disposed in the dielectric material stack and surrounding a first portion the first continuous metal guard ring at a first distance from the first continuous metal guard ring, and surrounding a second portion of the first continuous metal guard ring at a second distance smaller than the first distance, and where the test pads of the silicon bridge are disposed between the second portion of the first continuous metal guard ring and the metallization structure, the test pads coupled to the conductive routing.

In one embodiment, the substrate of the silicon bridge has a perimeter, and the silicon bridge further includes a metal-free region of the dielectric material stack surrounding the outer metal guard ring, where the metal-free region is disposed adjacent to the outer metal guard ring and adjacent to the perimeter of the substrate.

What is claimed is:

1. A semiconductor structure, comprising:
   a substrate having an insulating layer disposed thereon;
   a metallization structure disposed on the insulating layer, the metallization structure comprising conductive routing disposed in a dielectric material stack, wherein an uppermost layer of the metallization structure comprises first and second pluralities of conductive pads thereon;
   a plurality of individual guard ring segments disposed in the dielectric material stack and adjacent to the conductive routing;
   a first continuous metal guard ring disposed in the dielectric material stack and surrounding the plurality of individual guard ring segments and the conductive routing;
   a second continuous metal guard ring disposed in the dielectric material stack and surrounding the first continuous metal guard ring, wherein the first continuous metal guard ring is between the plurality of individual guard ring segments and the second continuous metal guard ring; and
   a plurality of conductive features between the first continuous metal guard ring and the plurality of individual guard ring segments.

2. The semiconductor structure of claim 1, wherein the plurality of conductive features comprises a plurality of test pads.

3. The semiconductor structure of claim 1, wherein the plurality of individual guard ring segments is arranged in two adjacent lines of staggered individual guard ring segments.

4. The semiconductor structure of claim 1, wherein the plurality of conductive features is coupled to the conductive routing by metal lines passing through the plurality of individual guard ring segments.

5. The semiconductor structure of claim 1, wherein the substrate has a perimeter, and wherein the semiconductor structure further comprises a metal-free region of the dielectric material stack surrounding the second continuous metal guard ring, the metal-free region disposed adjacent to the second continuous metal guard ring and adjacent to the perimeter of the substrate.

6. The semiconductor structure of claim 1, wherein one or both of the first continuous metal guard ring and the second continuous metal guard ring provides a hermetic seal for the metallization structure.

7. The semiconductor structure of claim 1, wherein at least one of the first metal guard ring or the second metal guard ring comprises a vertical stack of alternating metal lines and vias.

8. The semiconductor structure of claim 1, wherein the conductive routing electrically couples the first plurality of conductive pads with the second plurality of conductive pads.

9. The semiconductor structure of claim 1, wherein the substrate is free from having semiconductor devices disposed therein.

10. The semiconductor structure of claim 1, wherein the substrate is a single crystalline silicon substrate.

11. A semiconductor package, comprising:
    an embedded multi-die interconnection bridge (EMIB) comprising a silicon bridge disposed within a semiconductor package substrate, the silicon bridge comprising:
      a substrate having an insulating layer disposed thereon;
      a metallization structure disposed on the insulating layer, the metallization structure comprising conductive routing disposed in a dielectric material stack, wherein an uppermost layer of the metallization structure comprises first and second pluralities of conductive pads thereon;
      a plurality of individual guard ring segments disposed in the dielectric material stack and adjacent to the conductive routing;
      a first continuous metal guard ring disposed in the dielectric material stack and surrounding the plurality of individual guard ring segments and the conductive routing;
      a second continuous metal guard ring disposed in the dielectric material stack and surrounding the first continuous metal guard ring, wherein the first continuous metal guard ring is between the plurality of individual guard ring segments and the second continuous metal guard ring; and
      a plurality of conductive features between the first continuous metal guard ring and the plurality of individual guard ring segments;
    a first semiconductor die disposed on the semiconductor package substrate and electrically coupled to the first plurality of conductive pads of the silicon bridge; and
    a second semiconductor die disposed on the semiconductor package substrate and electrically coupled to the second plurality of conductive pads of the silicon bridge, the second semiconductor die electrically coupled to the first semiconductor die by the conductive routing of the metallization structure of the silicon bridge.

12. The semiconductor package of claim 11, wherein the first semiconductor die is a memory die, and the second semiconductor die is a logic die.

13. The semiconductor package of claim 11, wherein the plurality of conductive features comprises a plurality of test pads.

14. The semiconductor package of claim 11, wherein the plurality of individual guard ring segments is arranged in two adjacent lines of staggered individual guard ring segments.

15. The semiconductor package of claim 11, wherein the plurality of conductive features is coupled to the conductive routing by metal lines passing through the plurality of individual guard ring segments.

16. The semiconductor package of claim 11, wherein the substrate has a perimeter, and wherein the silicon bridge further comprises a metal-free region of the dielectric material stack surrounding the second continuous metal guard ring, the metal-free region disposed adjacent to the second continuous metal guard ring and adjacent to the perimeter of the substrate.

17. The semiconductor package of claim 11, wherein one or both of the first continuous metal guard ring and the second continuous metal guard ring provides a hermetic seal for the metallization structure.

18. The semiconductor package of claim 11, wherein at least one of the first metal guard ring or the second metal guard ring comprises a vertical stack of alternating metal lines and vias.

19. The semiconductor package of claim 11, wherein the conductive routing electrically couples the first plurality of conductive pads with the second plurality of conductive pads.

20. The semiconductor package of claim 11, wherein the substrate is free from having semiconductor devices disposed therein.

* * * * *